(12) United States Patent
Standing

(10) Patent No.: US 9,831,147 B2
(45) Date of Patent: Nov. 28, 2017

(54) PACKAGED SEMICONDUCTOR DEVICE WITH INTERNAL ELECTRICAL CONNECTIONS TO OUTER CONTACTS

(71) Applicant: Infineon Technologies Austria AG, Villach (AT)

(72) Inventor: Martin Standing, Velden (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/953,865

(22) Filed: Nov. 30, 2015

(65) Prior Publication Data
US 2017/0154831 A1 Jun. 1, 2017

(51) Int. Cl.
| | |
|---|---|
| H01L 23/48 | (2006.01) |
| H01L 23/31 | (2006.01) |
| H01L 21/02 | (2006.01) |
| H01L 21/288 | (2006.01) |
| H01L 21/3213 | (2006.01) |
| H01L 21/56 | (2006.01) |
| H01L 21/768 | (2006.01) |
| H01L 23/29 | (2006.01) |
| H01L 23/528 | (2006.01) |
| H01L 23/00 | (2006.01) |

(52) U.S. Cl.
CPC ........ *H01L 23/3107* (2013.01); *H01L 21/022* (2013.01); *H01L 21/288* (2013.01); *H01L 21/2885* (2013.01); *H01L 21/32134* (2013.01); *H01L 21/56* (2013.01); *H01L 21/76873* (2013.01); *H01L 21/76874* (2013.01); *H01L 21/76877* (2013.01); *H01L 23/295* (2013.01); *H01L 23/481* (2013.01); *H01L 23/528* (2013.01); *H01L 24/03* (2013.01); *H01L 24/06* (2013.01); *H01L 2224/036* (2013.01)

(58) Field of Classification Search
None
See application file for complete search history.

(56) References Cited

U.S. PATENT DOCUMENTS

| | | | |
|---|---|---|---|
| 2003/0132025 A1* | 7/2003 | Wakihara | H05K 1/0269 174/256 |
| 2010/0072588 A1* | 3/2010 | Yang | H01L 23/49816 257/676 |
| 2012/0129299 A1* | 5/2012 | Lin | H01L 21/4878 438/118 |
| 2012/0129300 A1* | 5/2012 | Lin | H01L 21/56 438/122 |
| 2016/0172306 A1* | 6/2016 | Scanlan | H01L 24/97 438/462 |

\* cited by examiner

*Primary Examiner* — Cory Eskridge
(74) *Attorney, Agent, or Firm* — Murphy, Bilak & Homiller, PLLC

(57) ABSTRACT

In an embodiment, an electronic component includes a first dielectric layer including an organic component having a decomposition temperature of at least 180° C., a semiconductor die embedded in the first dielectric layer, a second dielectric layer arranged on a first surface of the first dielectric layer, the second dielectric layer including a photo definable polymer composition and defining two or more discrete openings having conductive material, and a first substrate arranged on the second dielectric layer and on the conductive material. One or more contact pads are arranged on an outermost surface of the first substrate.

45 Claims, 10 Drawing Sheets

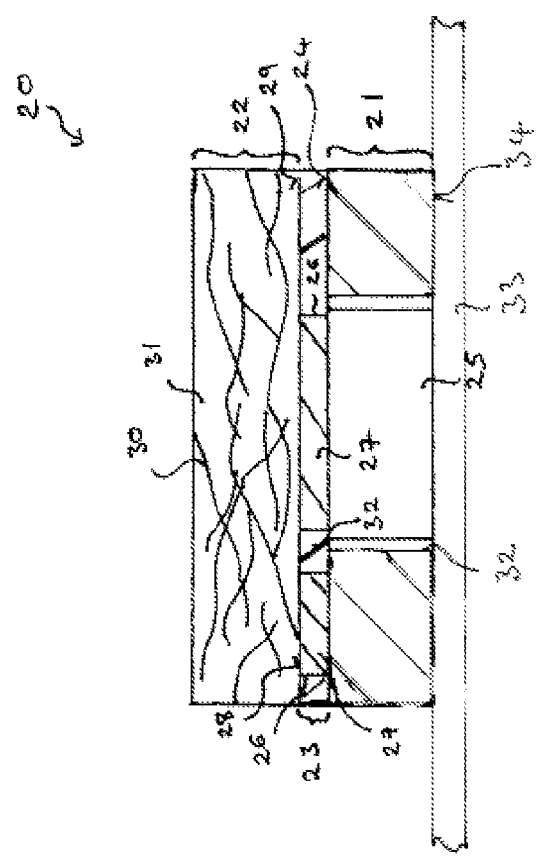

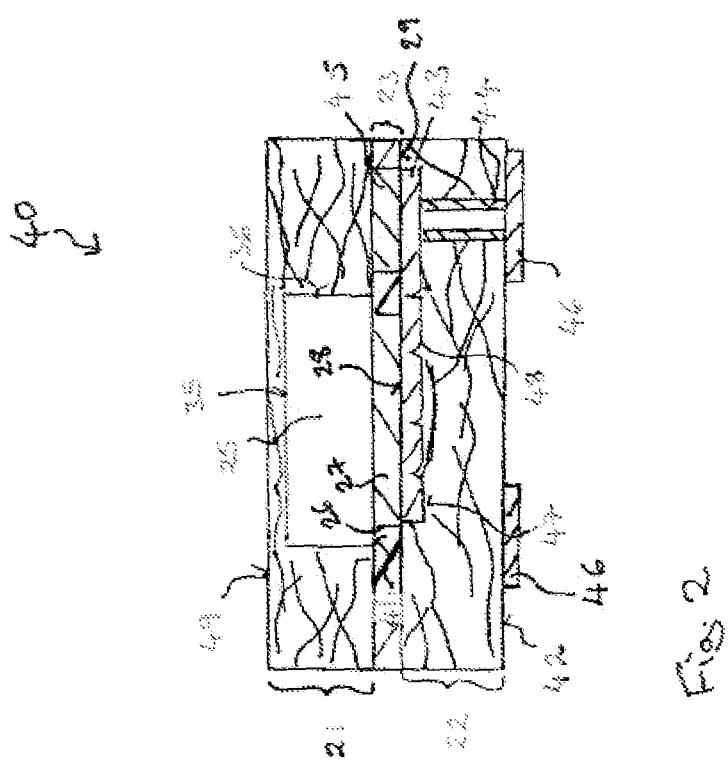

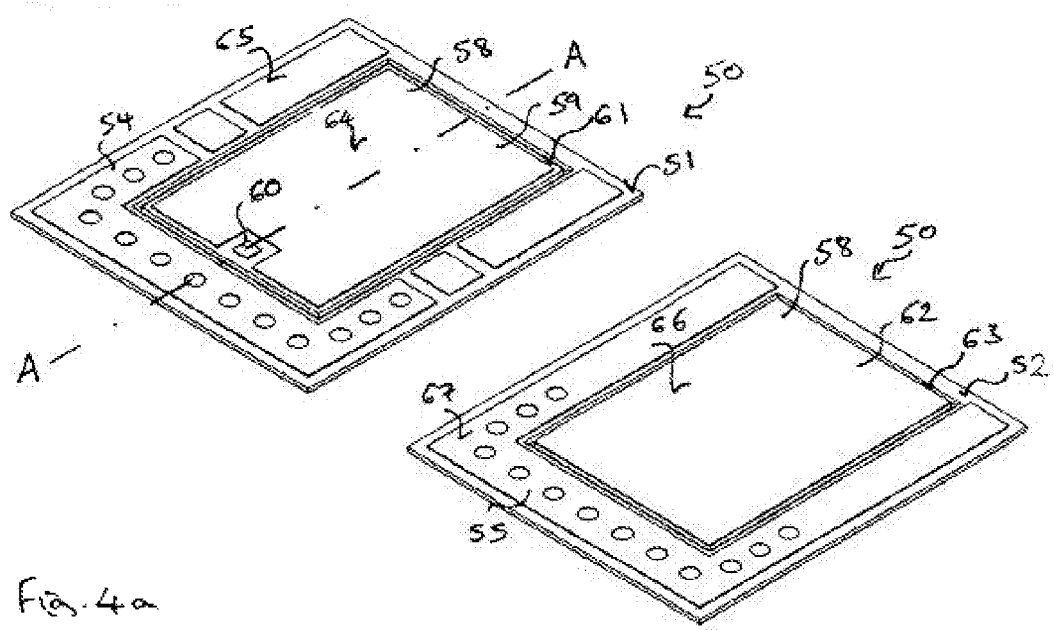
Fig. 4a
Fig. 4b
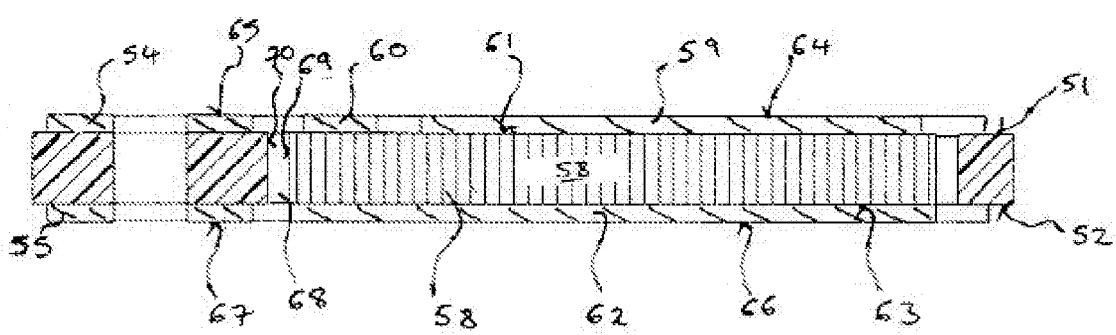
Fig. 4c

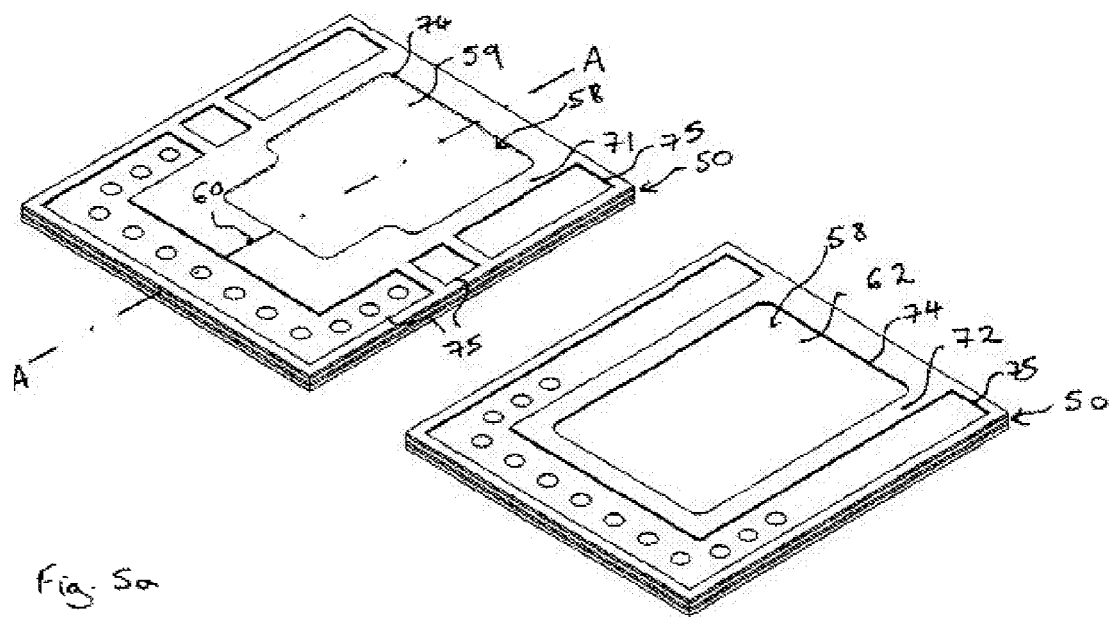
Fig. 5a
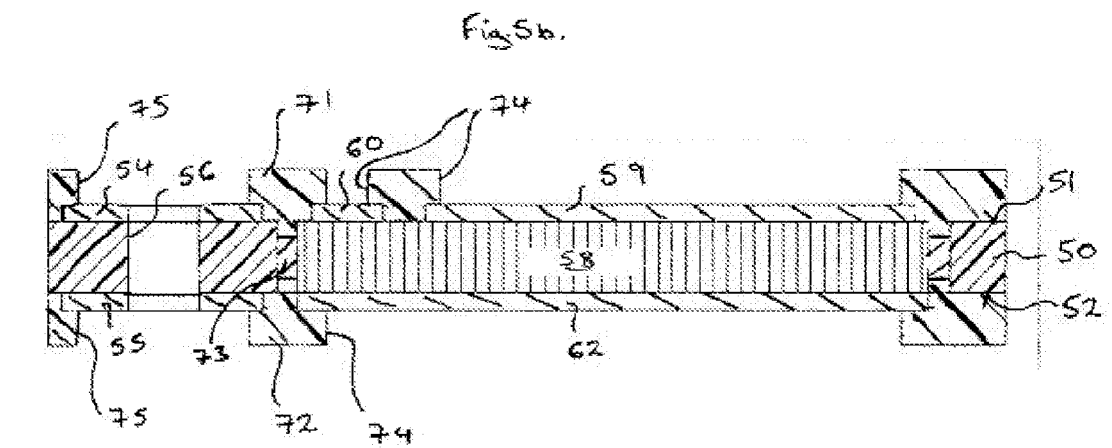
Fig. 5b.
Fig. 5c

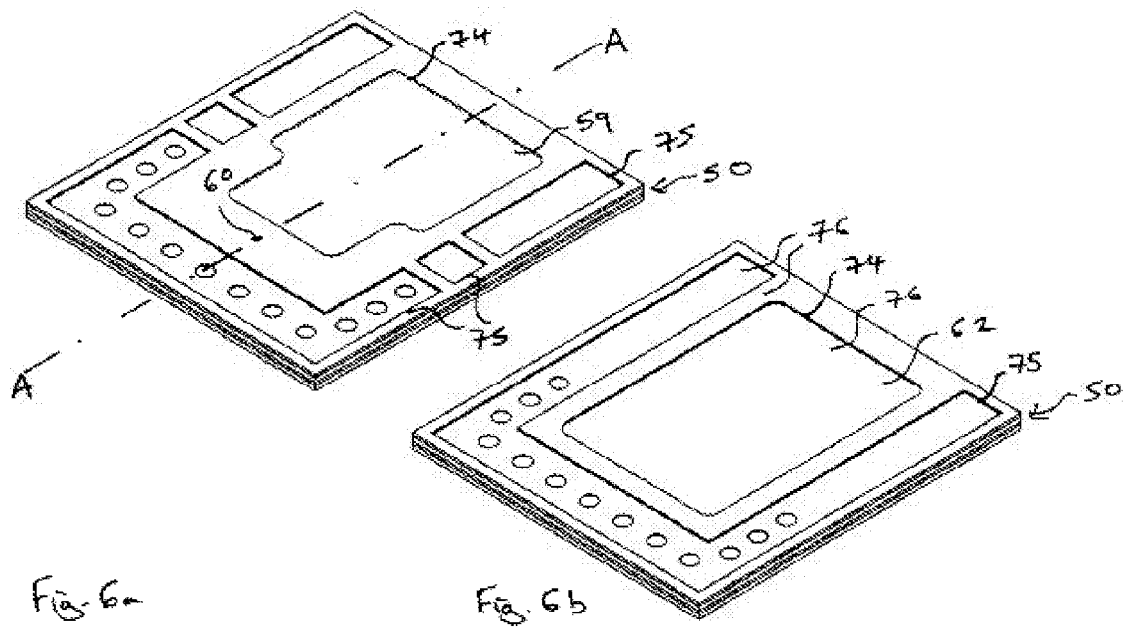
Fig. 6a
Fig. 6b
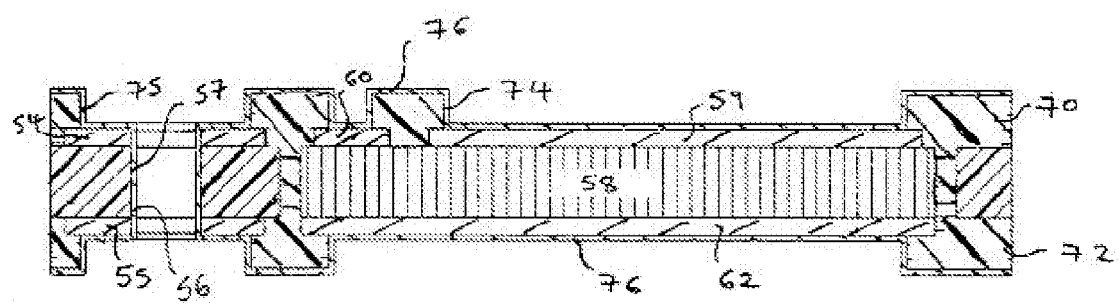
Fig. 6c

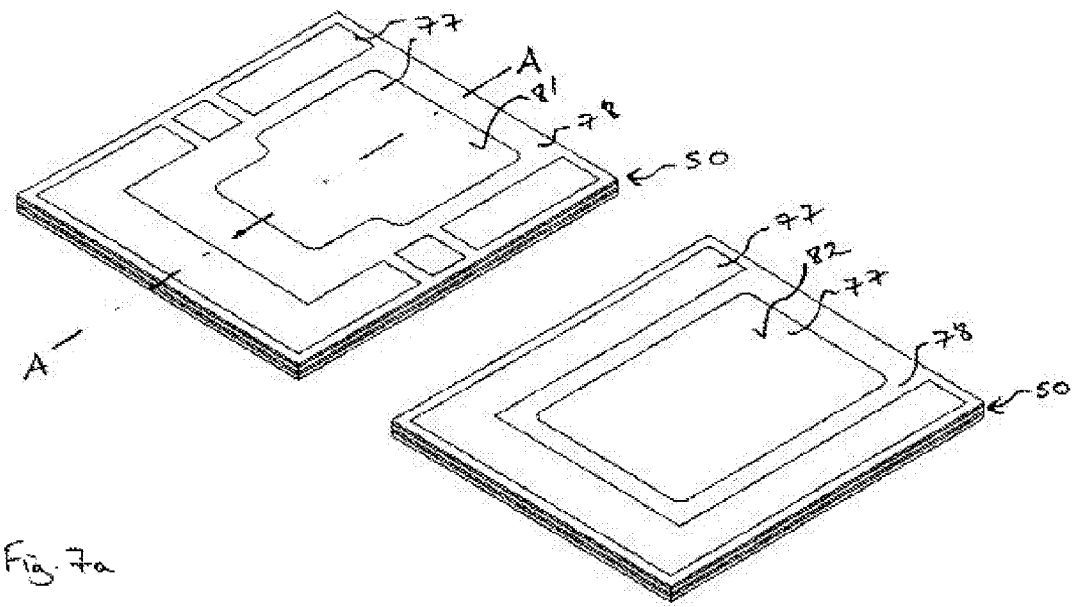
Fig. 7a
Fig. 7b
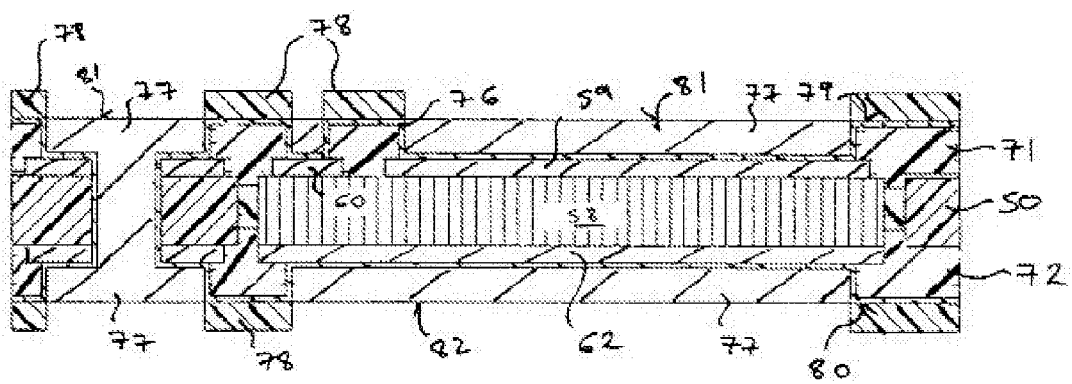
Fig. 7c
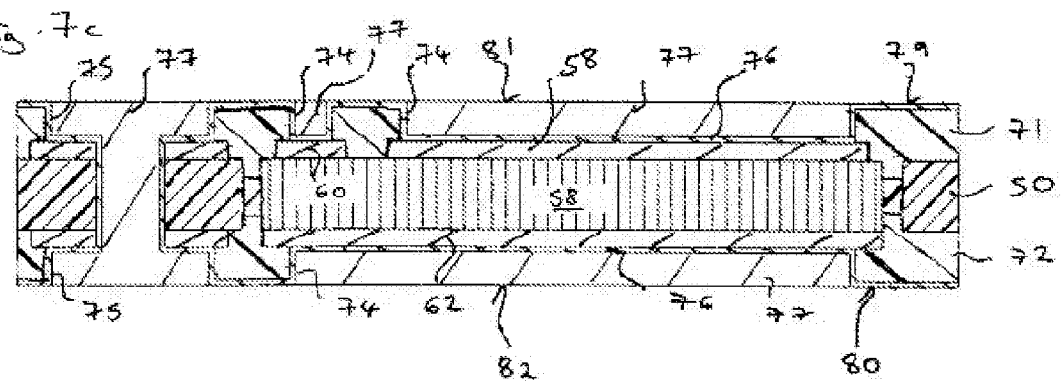
Fig. 8

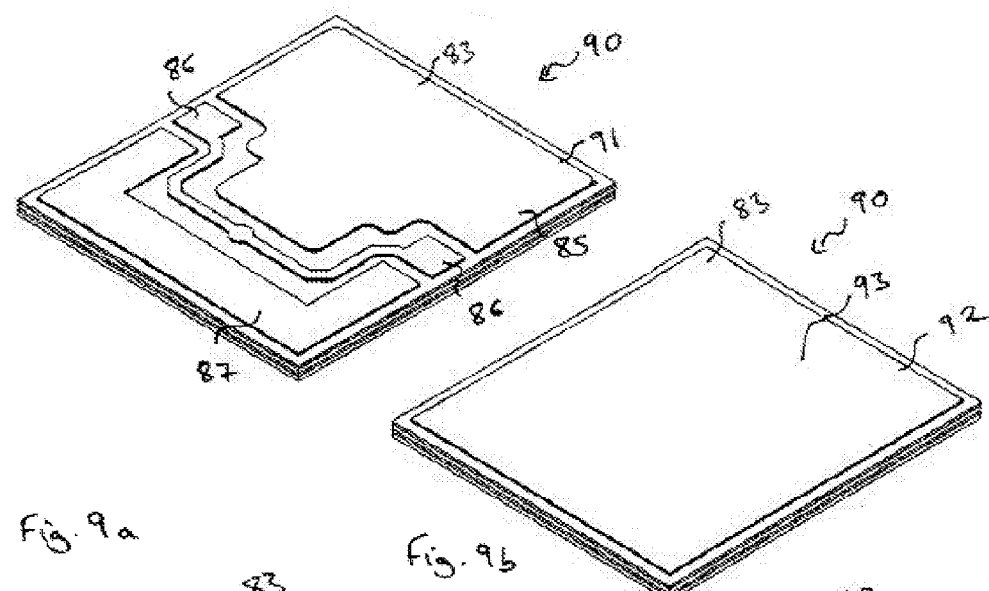
Fig. 9a  Fig. 9b
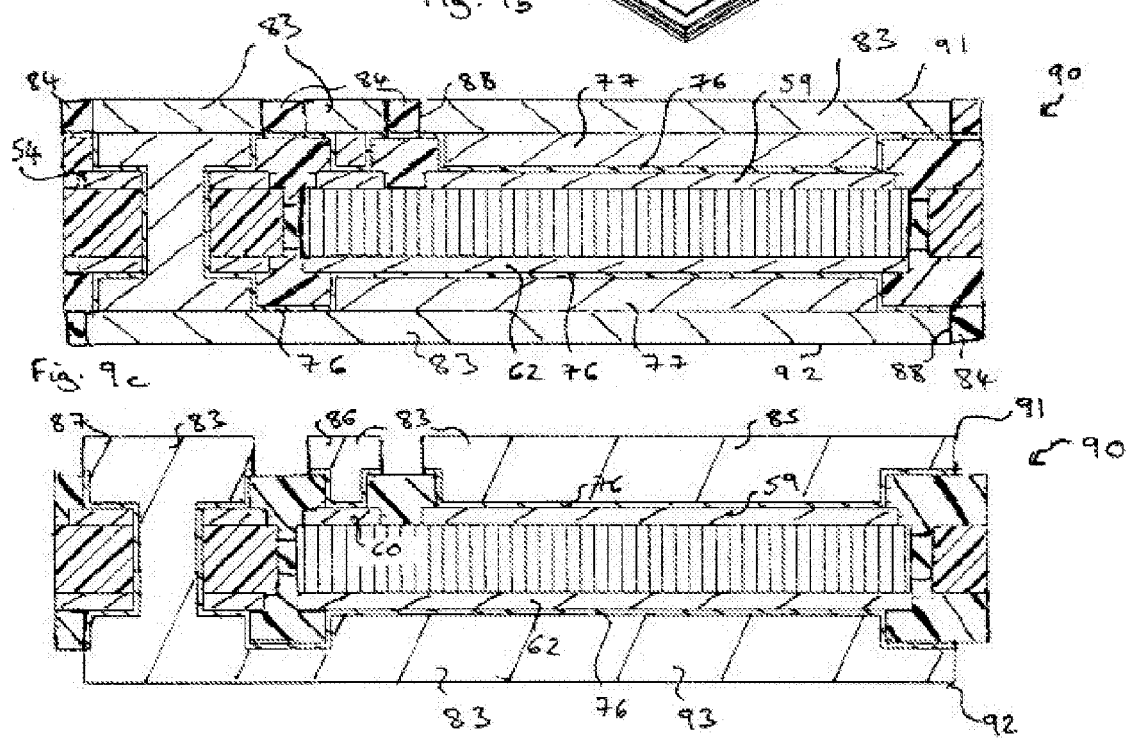
Fig. 9c
Fig. 10

PACKAGED SEMICONDUCTOR DEVICE WITH INTERNAL ELECTRICAL CONNECTIONS TO OUTER CONTACTS

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections. The housing may include a plastic material, such as epoxy resin, and may be formed by a mold process, such as injection molding.

SUMMARY

In an embodiment, an electronic component includes a first dielectric layer comprising an organic component with a decomposition temperature of at least 180° C., a semiconductor die embedded in the first dielectric layer, a second dielectric layer arranged on a first surface of the first dielectric layer, the second dielectric layer comprising a photo definable polymer composition and defining two or more discrete openings comprising conductive material, a first substrate arranged on the second dielectric layer and on the conductive material and one or more contact pads arranged on an outermost surface of the first substrate.

In an embodiment, an electronic component includes a first dielectric layer comprising an organic component with a decomposition temperature of at least 180° C., a semiconductor die embedded in the first dielectric layer, a second dielectric layer arranged on a first surface of the first dielectric layer and a first surface of the semiconductor die, the second dielectric layer comprising a photo definable polymer composition and defining a plurality of discrete openings, at least one first opening being arranged on the first surface of the first dielectric layer and at least one second opening being arranged on the semiconductor die, and a first conductive layer arranged in the first and second discrete openings. An upper surface of the conductive layer is substantially coplanar with an upper surface of the second dielectric layer.

In an embodiment, a method includes laminating a first substrate on a first surface of an electronic component comprising a first dielectric layer comprising an organic component with a decomposition temperature of at least 180° C., a semiconductor die embedded in the first dielectric layer, a second dielectric layer arranged on a first surface of the first dielectric layer, the second dielectric layer comprising a photo definable polymer composition and defining two or more discrete openings comprising conductive material, and a first conductive layer arranged on the second dielectric layer and the conductive material, and laminating a second conductive layer on the first substrate.

In an embodiment, a method includes embedding a semiconductor die in a first dielectric layer comprising an organic component with a decomposition temperature of at least 180° C., applying a second dielectric layer to a first surface of the first dielectric layer and a first surface of the semiconductor die, the second dielectric layer comprising a photo definable polymer composition, defining a plurality of openings in the dielectric layer, at least one first opening being arranged on the first surface of the first dielectric layer and at least one second opening being arranged on the semiconductor die, and applying a conductive material into the openings. The second dielectric layer and the conductive material have a substantially coplanar upper surface.

In an embodiment, a method includes embedding a semiconductor die in a first dielectric layer comprising an organic component with a decomposition temperature of at least 180° C., applying a second dielectric layer to a first surface of the first dielectric layer and a first surface of the semiconductor die, the second dielectric layer comprising a photo definable polymer composition, defining a plurality of openings in the second dielectric layer, at least one first opening being arranged on the first surface of the first dielectric layer and at least one second opening being arranged on the semiconductor die, applying a conductive material into the openings, the second dielectric layer and the conductive material having a substantially coplanar upper surface, applying a first conductive layer electrically coupling conductive material arranged in at least two openings, laminating a first substrate on the second dielectric layer and conductive layer, laminating a second conductive layer on the first substrate and electrically coupling the second conductive layer to the first conductive layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates an electronic component.

FIG. 2 illustrates an electronic cross sectional view of an electronic component and redistribution structure.

FIG. 4a illustrates a perspective top view of the dielectric panel including a semiconductor die.

FIG. 4b illustrates a perspective bottom view of the dielectric panel including the semiconductor die.

FIG. 4c illustrates a cross-sectional view of the dielectric panel and semiconductor die over the line A-A.

FIG. 5a illustrates a perspective top view of the dielectric layer applied to the dielectric panel including the semiconductor die.

FIG. 5b illustrates a perspective bottom view of the dielectric layer applied to the dielectric panel including the semiconductor die.

FIG. 5c illustrates a cross-sectional view of the dielectric layer applied to the dielectric panel and the semiconductor die.

FIG. 6a illustrates a perspective top view of a seed layer applied to the dielectric layer, the semiconductor die and the dielectric panel.

FIG. 6b illustrates a perspective bottom view of the seed layer applied to the dielectric layer, the semiconductor die and the dielectric panel.

FIG. 6c illustrates a cross-sectional view of the seed layer applied to the dielectric layer, the semiconductor die and the dielectric panel.

FIG. 7a illustrates a perspective top view of a conductive layer applied to openings in the dielectric layer.

FIG. 7b illustrates a perspective bottom view of a conductive layer applied to openings in the dielectric layer.

FIG. 7c illustrates a cross-sectional view of the conductive layer applied to include the dielectric layer.

FIG. 8 illustrates a cross-sectional view illustrating discrete portions of the conductive layer applied to the dielectric layer.

FIG. 9a illustrates a perspective top view of a further conductive layer applied to the conductive layer.

FIG. 9b illustrates a perspective bottom view of the further layer applied to the conductive layer.

FIG. 9c illustrates a cross-sectional view of the further layer applied to the conductive layer.

FIG. 10 illustrates a sectional view of the electronic component.

DETAILED DESCRIPTION

Figures 3A, 3B:
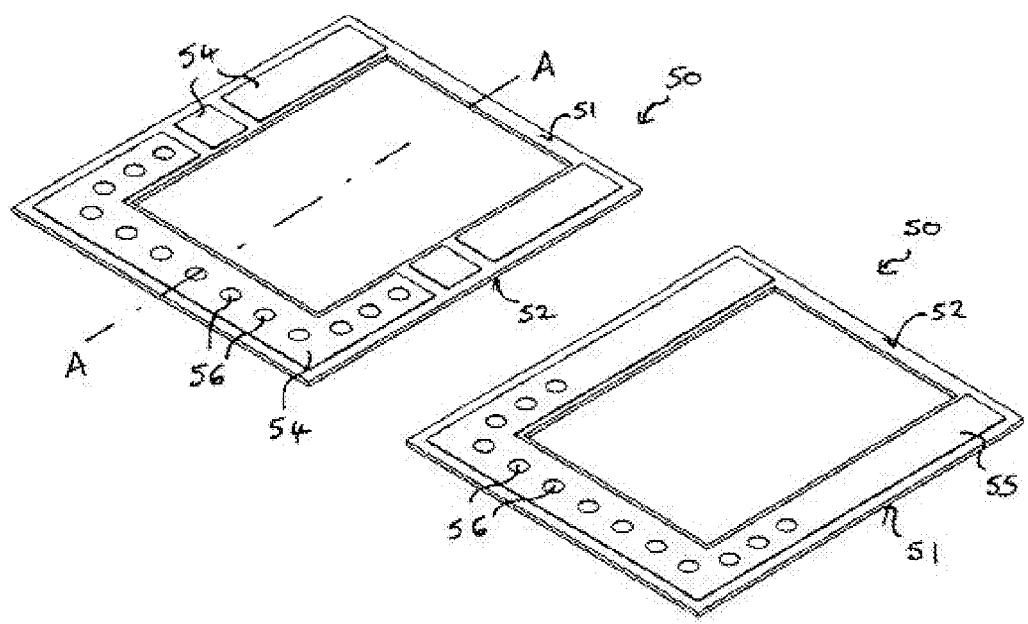
FIG. 3a illustrates a perspective top view of a dielectric panel.
FIG. 3b illustrates a perspective bottom view of a dielectric panel.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 illustrates an electronic component 20 including a first dielectric layer 21, a semiconductor die 25 embedded in the first dielectric layer 21 and a second dielectric layer 22 arranged on the first dielectric layer 21. The electronic component 20 further includes a third dielectric layer 23 which is arranged on a first surface 24 of the first dielectric layer 21 between the first dielectric layer 21 and the second dielectric layer 22.

The third dielectric layer 23 defines at least two discrete openings 26 which include conductive material 27. The second dielectric layer 22 is arranged on the third dielectric layer 23 and the conductive material 27 positioned in the openings 26. The semiconductor die 25 may have a thickness which is substantially the same as the thickness of the first dielectric layer 21.

In some embodiments, the semiconductor die 25 is positioned in an aperture 32 in the first dielectric layer 21 and is spaced at a distance from the material of the first dielectric layer 21. The semiconductor die 25 may be supported within the aperture by use of a carrier or support tape 33 which is arranged on a second surface 34 of the first dielectric layer 21 which opposes the first surface 24. In some embodiments, the semiconductor die 25 is embedded directly within the material of the first dielectric layer 21.

The electronic component 20 may be considered to have a multilayer or laminated structure in which the third dielectric layer 23 is positioned between the first dielectric layer 21 and the second dielectric layer 22. The three dielectric layers 21, 22, 23 may have differing compositions.

The first dielectric layer 21 includes an organic component which has a decomposition temperature of at least 180° C. The second dielectric layer 22 is provided by a substrate which may include a composite structure, for example a filler embedded in a dielectric matrix. The third dielectric layer 23 comprises a photodefinable polymer composition.

The third dielectric layer 23 includes a composition which is different to the composition of the first dielectric layer 21 and the composition of the second dielectric layer 22. The third dielectric layer 23 includes a composition which is photosensitive and may include polyimide.

The openings 26 may be formed in the third dielectric layer 23 by photoimaging techniques. The openings 26 extend through the thickness of the third dielectric layer 23 such that the conductive material 27 extends through the thickness of the dielectric layer 23. The upper surface 28 of the conductive material 27 and the upper surface 29 of the third dielectric layer 23 may be substantially coplanar. The third dielectric layer 23 includes discrete conductive areas formed by the conductive material 27.

Whilst the third dielectric layer 23 is applied by building up material on the first surface 24 of the first dielectric layer and defining openings using photoimaging techniques, the second dielectric layer 22 is pre-fabricated and applied as a layer to the third dielectric layer 23 by lamination. Techniques in which layers are built up and photostructured are frequently used in the fabrication of semiconductor devices at the wafer level. Lamination techniques in which pre-fabricated panels or boards are joined together are frequently used in the manufacture of circuit boards. Consequently, a combination of two differing technologies is used to fabricate a single electronic component 20.

At least one of the dielectric layers 21, 22, 23 may be used to support a conductive rewiring structure from the semiconductor die 25 to one or more contact pads arranged on an outermost surface of one or more of the first dielectric layer 21 and the second dielectric layer 22. One or more conductive vias not visible in the cross-sectional view of FIG. 1 may be used to electrically couple the semiconductor die 25 to the contact pad or pads.

The semiconductor die 25 may be a transistor device, such as a MOSFET (Metal oxide Semiconductor Field Effect Transistor) or an IGBT (Insulated Gate Bipolar Transistor) or a BJT (Bipolar Junction Transistor), for example. The semiconductor die 25 may also include an integrated circuit.

The electronic component 20 is not limited to including a single semiconductor die 25 and may include two or more semiconductor dies 25 which may be embedded in the first dielectric layer 21 laterally adjacent one another. For example, the semiconductor die 25 may include control circuitry for controlling one or more further semiconductor dies. In some embodiments, a semiconductor die including a gate driver for switching one or more transistor devices and the one or more transistor devices may be embedded in the first dielectric layer 21.

The third dielectric layer 23 is comprises a photodefinable dielectric material such as a photodefinable polymer composition, for example polyimide. A photodefinable polymer composition includes a polymer that changes its structure when exposed to light, for example light in the ultraviolet or visible region of the electromagnetic spectrum. The structural change results in hardening of the photo definable polymer composition when it is exposed to this light as a result of cross-linking between polymer chains or polymerisation of the polymer composition. The dielectric layers including a photo definable polymer composition may, in the uncured state, include a mixture of monomers, oligomers, and photoinitiators that conform into a hardened polymeric material after exposure to light. The dielectric layers including a photo definable polymer composition undergo photo-induced polymerisation to at least partially cure or harden the dielectric layer.

Some dielectric layers including a photodefinable polymer composition, such as dielectric layers including an epoxy resin, may be subjected to a thermal curing treatment in addition to a partial curing treatment performed by exposure to light. Some dielectric layers, such as dielectric layer including acrylate based polymers, may be substantially fully cured using photo-induced polymerisation alone.

The substrate providing the second dielectric layer 22 includes a filler embedded in a dielectric matrix. The filler may be used to adjust the rheology of the layer before hardening or curing, adjust the Coefficient of Thermal Expansion (CTE) and/or the heat resistance of the substrate. The filler may also increase the mechanical strength of composite. The filler may have the form of a plurality of fibres, such as glass fibres or carbon fibres, which may be woven and impregnated with a dielectric material, such as a polymer. The filler is not limited to fibres but may include other shapes. For example, the filler may include a plurality of particles which may have a substantially spherical form. The dielectric matrix of the substrate may include a thermosetting resin, such as epoxy resin, or a thermoplastic as the matrix.

In some embodiments, the substrate may be provided by a layer of so-called prepreg which includes partially cured or B-stage resin impregnated woven glass fibres or fully cured resin impregnated woven glass fibres. The resin may be an epoxy resin. In the embodiment illustrated in FIG. 1, the substrate includes a composite including glass-fibres 30 impregnated with a thermosetting resin 31. For example, the second dielectric layer 22 may include FR4.

The first dielectric layer 21 includes an organic component having a decomposition temperature of at least 180° C., or in some embodiments at least 220° C. An organic component is a carbon-containing component with which is predominately covalently bonded. The decomposition temperature is the temperature at which the organic component begins to chemically decompose. Consequently, the organic component can be considered to be chemically stable at temperatures below the decomposition temperature.

In some embodiments, the decomposition temperature lies within the range of 180° C. and 300° C. In some embodiments, the decomposition temperature lies within the range of 220° C. to 300° C. The organic component of the first dielectric layer 21 may be selected such that it remains chemically stable during subsequent processing.

In some embodiments, the first dielectric layer 21 includes a curable dielectric material that is substantially fully cured before the third dielectric layer 23 and the second dielectric layer 22 are applied to the first dielectric layer. For example, the first dielectric layer may include a thermosetting polymer, such as an epoxy resin, which is substantially fully cured before application of the third dielectric layer 23.

In some embodiments, the first dielectric layer 21 is provided by a substrate which may include the same composite as the second dielectric layer 22. In these embodiments, the third dielectric layer 23 is arranged between two substrates 21, 22 which both include a filler. These two dielectric layers 21, 22 may include a thermosetting dielectric such as epoxy resin which impregnates the filler and may include a composite such as FR4.

In some embodiments, a filler is not used in the first dielectric layer 21 in which the semiconductor die 25 is embedded, if the dielectric material has sufficient mechanical strength. For example, the first dielectric layer 21 may include a photodefinable polymer composition which is cured before application, imaging and curing of the third dielectric layer 23 and application of the second dielectric layer 22.

The photodefinable polymer composition may be substantially fully cured so that the first dielectric layer 21 is no longer curable by exposing to light. Consequently, the first dielectric layer 21 remains chemically and mechanically stable during the application and photostructuring of the third dielectric layer 23.

In some embodiments, the photodefinable polymer composition of the first dielectric layer 21 is partially cured so that some crosslinking with the third dielectric layer 23 takes place during a subsequent curing process.

In some embodiments, the first dielectric layer 21 and the second dielectric layer 22 are prefabricated. The semiconductor die 22 may be embedded in the first dielectric layer 21 when the first dielectric layer 21 is in the fully cured condition or in the B-stage condition. The third dielectric layer 23 may be applied to the first surface 24 of the first dielectric layer 21 and to the semiconductor die 25, openings 26 are formed and filled with conductive material 28. The second dielectric layer 22 is also provided as so-called prepreg or B-stage material in the form of a panel including a filler and a thermosetting resin in a partially cured or B-stage condition. In the B-stage condition, the panel has mechanical integrity and may be slightly adhesive in order to allow the panel to be adhered to the dielectric layer 23 and the conductive material 27 to produce the electronic component 20 with a laminated or multilayer stacked arrangement.

In embodiments in which one or more of the first dielectric layer 21 and the second dielectric layer 22 includes conductive vias extending through the thickness of the respective layer, the through-hole may be formed and the conductive material, which at least lines the walls of the through-hole, applied before or after the lamination process which produces the stacked structure is illustrated in FIG. 1.

FIG. 2 illustrates an electronic component 40 including the first dielectric layer 21, the second dielectric layer 22 and a third dielectric layer 23 which is positioned between the first dielectric layer 21 and second dielectric layer 22. The conductive redistribution structure between the semiconductor die 25 and outer contact pads 46 of the electronic component 40 is illustrated. The electronic component 40 may be mounted onto and electrically coupled with a higher level redistribution board such as a circuit board by way of the outer contact pads 46.

The semiconductor die 25 is embedded in the first dielectric layer 21. The semiconductor die 25 may have a thickness which is substantially the same as the thickness of the first dielectric layer 21 or may have a thickness which is less that the thickness of the first electric layer 21 such that its rear surface 35 is embedded within the first dielectric layer 21. The side faces 36 of the semiconductor die may be in direct contact with the material of the first dielectric layer 21 or may be spaced apart from the material of the first dielectric layer 21.

In this particular embodiment, the first dielectric layer 21 and the second dielectric layer 22 are provided by a substrate including a filler and a thermosetting dielectric matrix, and the third dielectric layer 23 includes a photodefinable polymer composition which is curable by exposure to light of a suitable wavelength. The first dielectric layer 21 and the second dielectric layer 22 may include FR4 and the third dielectric layer may include polyimide.

The third dielectric layer 23 includes two openings 26. A first opening 26 is arranged on the first surface 24 of the first dielectric layer 21 and second opening 26 is arranged above the semiconductor die 25. The openings 26 are filled with conductive material 27. The conductive material 27 may be copper, for example. The third dielectric layer 23 includes discrete regions of conductive material 27 which are not electrically coupled to one another.

The electronic component 40 is fabricated using two different classes of manufacturing technology and may be considered a hybrid technology. A photo-imaging build-up technology, commonly used in wafer level processing, is used to fabricate layers by deposition in the central portion and a lamination and microvia (blind via) technology, commonly used in printed circuit board manufacture, is used to fabricate the outer layers. For example, the third dielectric layer 23 is deposited and structured using photoimaging techniques since the third dielectric layer 23 includes a photodefinable polymer composition. A prefabricated second dielectric layer 22 may be laminated onto the third dielectric layer by applying pressure and heat.

FIG. 2 illustrates the electronic component 40 in an orientation suitable for mounting so that the upper surface 41 of the semiconductor die 25 and upper surface 29 of the third dielectric layer face downwards. In the embodiment illustrated in FIG. 2, a rewiring structure is provided which extends from the upper surface 41 of the semiconductor die 25 to the outermost surface 42 of the second dielectric layer 22. A first conductive layer 43 is arranged on the upper surface 29 of the third dielectric layer 23 and on the upper surface 28 of the conductive material 27 such that it extends from the conductive material 27 arranged on the opening 26 positioned on the semiconductor die 25 to the conductive material 27 arranged in the opening 26 arranged on the first dielectric layer 21. The first conductive layer 43 electrically couples the two discrete areas of conductive material 27 and may be used to provide an electrical connection which extends from the semiconductor die 25 onto the first dielectric layer 21 adjacent to the semiconductor die 25.

At least one conductive via 44 is provided which extends from the outermost surface 42 of the second dielectric layer 22 to the first conductive layer 43. In the illustrated embodiment, the conductive via 44 is arranged above the conductive region 45 arranged on first dielectric layer 21.

A second conductive layer 46 is arranged on the outermost surface 42 of the second dielectric layer 22. The second conductive layer 46 may be structured to provide outer contact pads for the electronic component 40. The first conductive layer 43, second conductive layer 46 and conductive material 27 may include copper.

The third dielectric layer 23 may be deposited onto the first dielectric layer 21 and structured using photolithographic techniques to form the discrete openings 26. The conductive material 27 and first conductive layer 43 may be deposited by electroplating. After the first conductive layer 43 is applied to the third dielectric layer 23, the second dielectric layer 22 is laminated onto the first conductive layer 43 and the third dielectric layer 23. The further conductive layer 46 may be provided in the form of a foil which is laminated onto the second dielectric layer 22. The second dielectric layer 22 including the further conductive layer 46 may be laminated onto the first conductive layer 43 and third dielectric layer 23 by applying pressure and heat.

After the second dielectric layer has been laminated onto the first dielectric layer 21, the conductive via 44 may be formed by introducing a via into the second dielectric layer 22 from the first surface 42 such that a portion of the first conductive layer 43 forms the base of the via. The via may be introduced into the second dielectric layer 22 by mechanical drilling or laser drilling. Conductive material may be applied to form a conductive layer on side faces of the via to produce the conductive via 44 and to couple the conductive via 44 to the second conductive layer 46.

The outermost surface 47 of the first conductive layer 43 may have a rough surface in order to improve the adhesion between the second dielectric layer 22 and the first conductive layer 43. In some embodiments, the grain boundaries of the metal providing the first conductive layer 43 may be preferably etched to provide surface roughness as is indicated in FIG. 2 by the substantially V-shaped grain boundary regions 48.

The combination of photoimaging methods for depositing the third dielectric layer 23, conductive material 27 and first conductive layer 43 and circuit board fabrication methods for applying the second dielectric layer 22 and second conductive layer 46 by lamination and forming the conductive vias 44 may be used to produce an SMD (Surface Mount Device) component.

The use of photo-imaging technology allows very high density connections and the fabrication of large and small connection areas. A thickness metal layer can be built up close to the semiconductor die 25 surfaces by the deposition of conductive material 27 in the opening 26 on the semiconductor die 25 and deposition of a further conductive layer 43 on the conductive material on the semiconductor die 25. Photo-imaging processing can be considered to be cost effective and simple build up stages are supported for the inner layers of the stack. The final footprint is positive, i.e. the outermost conductive layer 46 stands higher than the surrounding area of the second dielectric layer 22, which is suitable for providing an SMD component.

In some non-illustrated embodiments, a further dielectric layer in the form of a substrate with a filler embedded in a thermosetting dielectric matrix may be arranged on a second surface 49 of the first dielectric layer 21 opposing the upper surface 41. The further dielectric layer may cover the semiconductor die 25 and outermost surface 47 of the first dielectric layer 21. A further conductive layer may be arranged on the outermost surface of the third dielectric layer. A stack of three dielectric layers of the same or very similar structure, such as a filler embedded in a dielectric matrix, with the semiconductor die embedded in a central dielectric layer may be used to compensate for any stress arising within the electronic component.

Methods of fabricating an electronic component including a semiconductor die embedded in a dielectric panel will be described with reference to FIGS. 3 to 10.

Figure 3C:
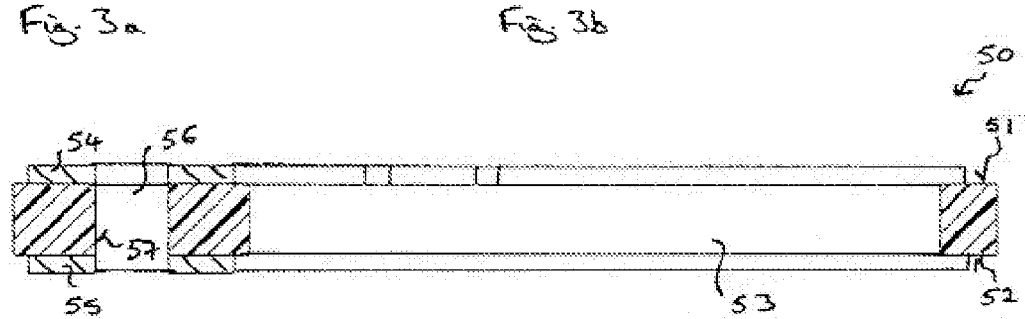
FIG. 3c illustrates a cross-sectional view of the dielectric panel along the line A-A.

FIG. 3a illustrates a perspective plan view of an upper surface 51 of a single component position of a non-illustrated panel including a plurality of component positions including a substrate 50. FIG. 3b illustrates a three-dimensional perspective view of the lower surface 52 of the substrate 50. FIG. 3c illustrates a cross-sectional view along the line A-A.

The methods will be described with reference to a single component position. However, in practice the methods will be carried out on a panel including a plurality of component positions, for example 10's, 100's or 1000's of component positions.

The substrate 50 includes an aperture 53 having dimensions suitable for accommodating a semiconductor die. In this embodiment, the substrate 50 provides a dielectric layer which includes a matrix of a thermosetting polymer and a filler such as woven glass fibres. However, in other embodiments, the filler may be omitted. The substrate 50 includes an organic component with a decomposition temperature of 180° C. or more. A first conductive layer 54 is arranged on regions of the upper surface 51 of the substrate 50 around the periphery of the aperture 53. Similarly, a second conductive layer 55 is arranged on the lower surface 52 of the substrate 50. The first conductive layer 54 and the second conductive layer 55 may include a metal foil such as a copper foil. One or more through-holes or vias 56 are provided adjacent the aperture 53 for the semiconductor die and extend through the first conductive layer 54, the substrate 50 and the second conductive layer 55. The sidewalls 57 of the through-hole 56 are bounded by the substrate 50 are electrically insulative. In other non-illustrated embodiments, a conductive layer may be provided on the sidewalls 57 to produce a conductive via which electrically couples the first conductive layer 54 to the second conductive layer 55.

The first conductive layer 54 may include two or more discrete portions which are electrically insulated from one another by intervening regions of the substrate 50. The second conductive layer 55 may also include two or more discrete portions. The through-holes 56 may be provided in one or more of these portions. In the embodiment illustrated in FIG. 3, the first conductive layer 54 and the second conductive layer 55 are arranged adjacent three sides of the aperture 53. However, the first conductive layer 54 and the second conductive layer 55 may be arranged on fewer or more sides of the aperture 53 and may be arranged on differing number of sides from one another depending on the redistribution structure of the finished electronic component.

The first conductive layer 54, the substrate 50 and the second conductive layer 55 may be provided by a printed circuit board in which the aperture 53, through-holes 56 and the conductive layers 54, 55 are structured using techniques such as mechanical drilling, laser drilling and etching.

The panel including one or more component positions may include a core substrate such as a thin FR4 laminate with a copper layer top and bottom. The panel may be fully processed before the semiconductor die is inserted into the aperture. For example, the through-holes or vias 56 may be drilled and the copper etched to form the required pull back or spacing from semiconductor die aperture and to create discrete conductive portions forming the base circuitry nodes on the substrate 50. The total substrate thickness including the conductive layers 54, 55 providing metallization may match the total semiconductor die thickness including the die metallization.

The vias may be drilled and etched without a conductive layer being applied to the side walls of the vias. The plating for the vias may not fully fill the vias during the subsequent plate up stages. If the via is only plated as a barrel or cylinder around the via, during a subsequent plating process the holes could be tented to prevent partial closure and possible risks associated with chemical entrapment.

FIG. 4a illustrates a perspective top view, FIG. 4b a perspective bottom view and FIG. 4c a cross-sectional view along the line A-A after the insertion of a semiconductor die 58 in the aperture 53 of the substrate 50.

The semiconductor die 58 includes a transistor device, in particular a vertical transistor device including a source pad 59 and a gate pad 60 on an upper surface 61 and a drain pad 62 on the lower surface 63. However, the semiconductor die 58 is not limited to a transistor device and may include other types of devices. The semiconductor die 58 is not limited to including a vertical device and may include a lateral device in which the pads are arranged on a single surface, such as a lateral transistor device, for example.

The upper surface 64 of the metallisation on the upper surface 61 of the semiconductor die 58 is substantially coplanar with the upper surface 65 of the first conductive layer 54. The lower surface 66 of the rear of the metallisation arranged on the rear surface 63 of the semiconductor die 58 is substantially coplanar with the lower surface 67 the second conductive layer 55. In the illustrated embodiment, the semiconductor die 58 has a thickness which is substantially the same as the thickness of the substrate 50. The gate pad 60 and source pad 59 have a thickness which is substantially the same as the thickness of the first conductive layer 54. The drain pad 62 has a thickness which substantially corresponds to the thickness of the second conductive layer 55. The semiconductor die 58 has lateral dimensions such that there is a gap 68 between side faces 69 of the semiconductor die 58 and the side faces 70 defining the aperture 53.

Before insertion of the semiconductor die 58 in the aperture 53 in the substrate 50, an adhesive tape or carrier plate may be applied to the lower surface 52 of the substrate 50 to provide a temporary base to the aperture 53 and a support for the semiconductor die 58 during subsequent the next manufacturing processes. In embodiments in which a recess is provided for accommodating the semiconductor die, the base of the recess may be provided by a portion of the substrate 50 or a further substrate attached to the lower surface 52 of the substrate 50. If a recess is used, the adhesive tape or carrier plate may be omitted.

FIG. 5a illustrates a perspective top view, FIG. 5b a perspective bottom view and FIG. 5c a cross-sectional view of a first dielectric layer 71 applied to the upper surface 51 of the substrate 50, in particular in regions between the first conductive layer 54 and the source pad 59 and the gate pad 60. The first dielectric layer 71 extends over the gap 68 between the semiconductor die 58 and the substrate 50 and is used to secure the semiconductor die 58 in the aperture 53. The first dielectric layer 71 may have a form or structure such that it is positioned on and covers edge regions of the portions of the first conductive layer 54, the source pad 59 and the gate pad 60. This overlap of the edge regions may be used to provide additional mechanical support between the semiconductor die 58 and the substrate 50 and between the first dielectric layer 71 and the first conductive layer 54, the source pad 59 and the gate pad 60

A second dielectric layer 72 is arranged on the lower surface 52 of the substrate 50 in regions between portions of the second dielectric layer 55 and between the substrate 50 and the semiconductor die 58. If an adhesive tape is used to secure the semiconductor die 58 in the aperture 53 during deposition of the first dielectric layer 71, this adhesive tape may be removed before application of the second dielectric layer 72. The second dielectric layer 72 is arranged at the periphery of the aperture 53 such that it extends from the substrate 50 to the semiconductor die 58, bridging the gap at the periphery of the aperture 53 and assisting to secure the semiconductor die 58 within the aperture 53. The second dielectric layer 72 may also have a lateral extent such that peripheral regions of the second dielectric layer 55 and the drain pad 62 are covered. The through-holes 56 remain free of the dielectric layers 71, 72. The highest surface on the assembly is the surface of the dielectric layers 71, 72, which may stand around 10-40 μm higher than the surrounding copper areas. The dielectric layers 71, 72 include a photo definable polymer composition and may be structured by photoimaging techniques.

The tape or carrier plate may be used to hold the semiconductor die 58 in place during the subsequent application of a polymer layer such as a photo-imagable dielectric polymer, on the upper surface 51 of the substrate 50. The tape may be a heat release tape or a UV release tape. A heat release tape enables the polymer layer on the upper surface 51 of the substrate 50 to be fully processed through imaging, developing and a full or partial cure. A partial cure enables some cross-polymerization of the second application if the first layer is not completely cured. The dielectric polymer may include an epoxy resin. An epoxy resin can be cured between 150 & 200° C. The tapes may have a temperature at which the adhesive strength breaks down of 175° C., for example.

The material providing the dielectric may include a polymer of a high molecular weight and have a viscosity that may be controlled by the addition of volatiles. The material may include a UV-acrylate photosensitive component and one or more fillers, which also increases viscosity. In order to avoid having to remove the solvent from a thick film, for example material in the gap 68 between the semiconductor die 58 and the side face of the aperture 53, 100% solid resin systems containing no volatile elements may be used in the vertical section between the die edge and the substrate.

In some embodiments, one or more additional members 73 may be arranged between the side faces 70 of the aperture 53 and the side faces 69 of the semiconductor die 58. The additional member 73 may also have an adhesive function and assist in securing side face 69 of the semiconductor die 58 to the side face 70 of the aperture 53. The additional member 73 may be in contact with both the first dielectric layer 71 applied to the upper surface 51 of the substrate 50 and with the second dielectric layer 72 applied to the lower surface 52 of the substrate 50.

The dielectric layers 71, 72 are structured or patterned to define openings 74 having a base formed by portions of the metallisation of the semiconductor die 58 and opening 75 having a base formed by portions of the conductive layers 54, 55 arranged on the substrate 50. The first dielectric layer 71 and the second dielectric layer 72 include a different structure and/or composition from the substrate 50. In some embodiments, the dielectric material for the dielectric layers 71, 72 may be photoimagable in order that the first layer 71 and the second layer 72 be structured using photolithographic techniques to provide the plurality of openings 74, 75.

FIG. 6a illustrates a perspective top view, FIG. 6b a perspective bottom view and FIG. 6c a cross-sectional view of a seed layer. A conductive seed layer 76 is applied which may substantially entirely cover the first dielectric layer 71, the first conductive layer 54, the gate pad 60, the source pad 59, the second dielectric layer 72, the drain pad 62 and the second conductive layer 55. In addition, the conductive seed layer 76 covers the sidewalls 57 of the through-hole 56. The conductive seed layer 76 may be applied by methods such as electroless deposition or by direct metallisation. The conductive seed layer 76 may include copper, for example.

As the conductive seed layer 76 extends between all of the conductive components, the first conductive layer 54 is electrically coupled to the second conductive layer 55 as well as to each of the contact pads 59, 60, 62 of the semiconductor die 58. The conductive seed layer 76 may be used in subsequent manufacturing processes to provide a conductive surface onto which one or more further conductive layers may be applied by electroplating.

FIG. 7a illustrates a perspective top view, FIG. 7b a perspective bottom view and FIG. 7c a cross-sectional view of a third conductive layer 77 which has been applied to the seed layer 76 by electroplating. The third conductive layer 77 is arranged on the first conductive layer 54 and extends through the through-hole 56 to the opposing side of the substrate 50 and is also arranged on second conductive layer 55. The third conductive layer 77 is also arranged on the gate pad 60, source pad 59 and the drain pad 62. The lateral extent of the third conductive layer 77 may be defined by use of a mask 78 which is applied to portions of the seed layer 76 arranged on the upper surface 79 of the first dielectric layer 71 and the lower surface 80 of the second dielectric layer 72. The mask 78 has a lateral form corresponding to the underlying dielectric layers 71, 72. The third conductive layer 77 electrically couples the conductive layers 54, 55 in regions adjacent the aperture 53 and may fill the through-holes 56 which extend through the substrate 50. In some embodiments, the third conductive layer 77 may line the sidewalls 57 of the through hole 56 such that the central region remains unfilled by the third conductive layer 77.

FIG. 8 illustrates the arrangement of FIG. 7 after the subsequent removal of the mask 78. FIG. 8 illustrates that the third conductive layer 77 has a planarising effect to produce an arrangement having substantially flat upper and lower surfaces. The third conductive layer 77 may have a thickness such that its upper surface 81 is substantially coplanar with the upper surface 79 of the first dielectric layer 71 and its lower surface 82 is substantially coplanar with the lower surface 80 of the seed layer 76 arranged on the lower surface 52 of the substrate 50. The third conductive layer 77 can be considered to fill the openings 74, 75 formed by the first dielectric layer 71 and the second dielectric layer 72.

FIG. 9a illustrates a perspective top view, FIG. 9b a perspective bottom view and FIG. 9c illustrates a cross-sectional view of a fourth conductive layer 83 applied to the third conductive layer 77. The thickness of the redistribution structure may be increased by applying the fourth conductive layer 83 to the third conductive layer 77. A mask 84 may be applied to portions of the first dielectric layer 71 and the second dielectric layer 72 such that the lateral extent of the openings 88 provided is larger than the lateral extent of the underlying region of the third conductive layer 77. These openings 88 in the mask 84 may be filled with the fourth conductive layer 83. The fourth conductive layer 83 overlaps peripheral portions of the first dielectric layer 71 and the second dielectric layer 72 due to the lateral arrangement of the openings. The fourth conductive layer 83 may be applied by electroplating, for example, as the seed layer 76 is arranged on portions of the first dielectric layer 71 and second dielectric layer 72. The fourth conductive layer 83 may have a lateral extent which differs from the lateral extent of the third conductive layer 77. The fourth conductive layer 83 may be arranged to couple discrete conductive areas coupled to the semiconductor die 58 to discrete conductive regions on the first surface 51 of the substrate 50 adjacent the semiconductor die 58.

A portion of the fourth conductive layer 83 may be used to electrically couple the source pad 59 to portions of the first conductive layer 54 which are arranged adjacent the aperture 53 on the upper surface 51 of the substrate 50 and provide a source pad 85. A further portion of the fourth conductive layer 83 may be used to electrically couple the gate pad 60 to portions of the first conductive layer 54 which are arranged adjacent the aperture 53 on the upper surface 51 of the substrate 50 and provide a gate pad 86. The fourth conductive layer 83 is also used to electrically couple the drain pad 62 to the conductive material filling the through-hole 56 and to a portion of the second conductive layer 55 arranged on the lower surface 52 and to a portion of the first conductive layer 54 arranged on the upper surface 52 of the substrate 50. The drain pad 62 is electrically coupled to a drain contact pad 87 provided by a portion of the fourth conductive layer 83 arranged on the opposing side of the substrate 50.

FIG. 10 illustrates the electronic component 90 after the mask 84 and portions of the seed layer 76 which extend between portions of the fourth conductive layer 83 have been removed in order to electrically insulate the various portions of the fourth conductive layer 83 from one another. The remaining free-lying portions of the seed layer 76 may be removed by wet etching, for example. An etch including formic acid may be used to etch a seed layer including copper.

The redistribution structure of the electronic component 90 is built up by depositing at least one dielectric layer 53 and at least one conductive layer 77, 83 onto the substrate 50. As is illustrated in FIG. 10, the electronic component 90 has a lower surface 91 and an upper surface 92. The lower surface 91 includes a pad 85 electrically coupled to the source pad 59 of the semiconductor die, a pad 86 electrically coupled to the gate pad 60 only and a pad 87 which is electrically coupled to the drain pad 62 by the third conductive layer 77 positioned in the through-hole 56, a portion 93 of the fourth conductive layer 83 positioned on the upper surface 92 of the electronic component 90. The pads 85, 86, 87 may provide a surface mountable electronic component 90 in which the semiconductor die 58 is embedded in the substrate 50.

After the resist or mask 84 has been stripped, the seed layer 76 may be removed by use of a copper etch which is used over the entire surface. The etch may remove a few microns from the top of the fourth conductive layer 83 and may act as a roughening etch for good adhesion in a subsequent lamination process. A formic acid chemical etch or "mech etch" can be used to produce a surface for adhesion as the formic acid process attacks the grain boundaries preferentially.

The electronic component 90 may be used in various applications. In these embodiments, the contact pads 85, 86, 87 may provide the outer contact surfaces of the electronic component 90 which are electrically coupled to, for example soft soldered, to conductive pads arranged on a higher level substrate. However, the electronic component 90 may also be used in a laminated electronic component which includes at least one further substrate. In these embodiments, the contact pads 85, 86, 87 may provide a portion of the internal redistribution structure and may have a lateral arrangement which differs from the lateral arrangement of the outer contact pads of the laminated electronic component.

The electronic component includes metallic portions built up from four layers, for example the conductive layer 54, seed layer 76, third conductive layer 77 and fourth conductive layer 83 on the substrate 50, and the die metallization such as the source pad 59, the seed layer 76, third conductive layer 77 and fourth conductive layer 83 on the semiconductor die 58.

FIGS. 11 to 13b illustrate the fabrication of a laminated electronic component using the electronic component 90 including a semiconductor die embedded in a substrate 50 which forms the first dielectric layer of the laminated electronic component 110.

Figure 11:
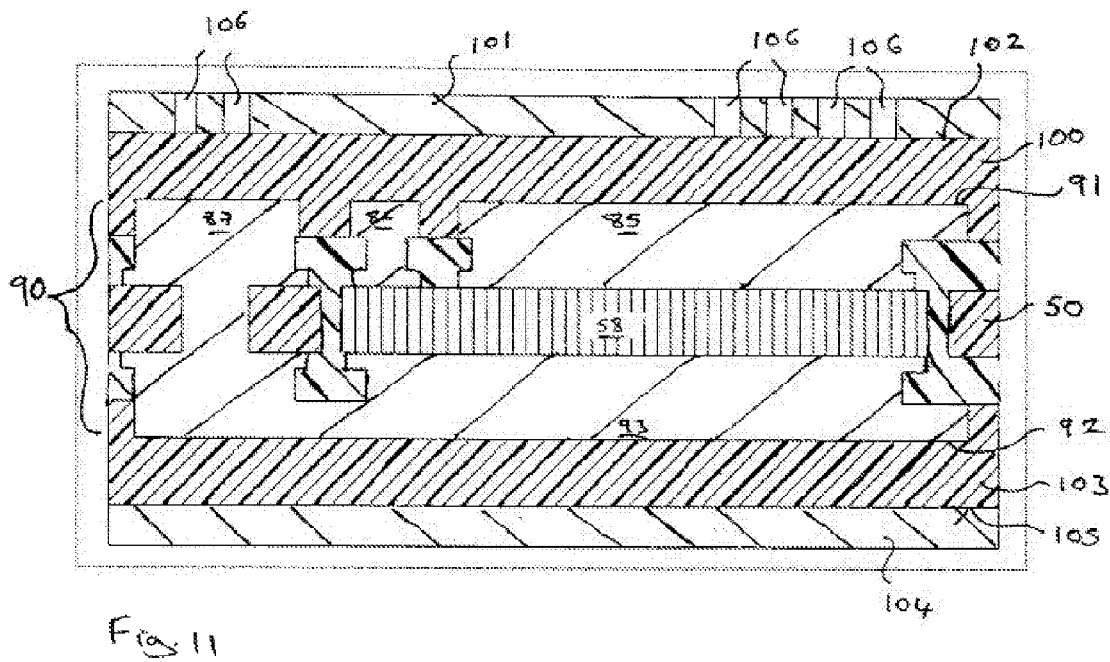
FIG. 11 illustrates a cross-sectional view including a substrate applied to the electronic component of FIG. 10.

FIG. 11 illustrates a cross-sectional view of the electronic component 90 after a second substrate 100 has been applied to the lower surface 91 of the electronic component 90. A further conductive layer 101 has been applied to the outermost surface 102 of the second substrate 100. The second substrate 100 may have the same composition as the first substrate 50. For example, the second substrate 50 may include a woven fibre filler impregnated with a thermosetting resin such as epoxy resin. The first and second substrates 50, 100 may include FR4, for example. The second substrate 100 may be applied to the lower surface 91 of the electronic component 90 whilst in a partially cured condition such that it conforms to the lower surface 91 of the electronic component 90 and is arranged in regions between the contact pads 85, 86, 87.

In some embodiments, a third substrate 103 may be applied to the rear surface 92 of the electronic component 90 so that the electronic component 90 can be considered to be sandwiched between two further substrates 100, 103. A further conductive layer 104 may be arranged on the outermost surface 105 of the third substrate 103. The further conductive layer 104 may be electrically insulated from the electronic component 90 and may serve as useful surface for heat dissipation or for thermally coupling to a further heat sink.

The first conductive layer 101 may provide a portion of the redistribution structure of the laminated device and/or serve as a mask by introducing through-holes 106 through the thickness of the conductive layer 101 each having a base formed by a portion of the second substrate 100. The through-holes 106 may be formed by etching and may be used to guide the introduction of through-holes 108 through the thickness of the second substrate 100 such that portions of the contact pads 85, 86, 87 are exposed in the base of the through-holes 108. The through-holes 108 may be formed by laser drilling or mechanical drilling, for example. The thick copper over the semiconductor die 58 produced by the metallization 59, 60, 62, seed layer 76, third conductive layer 77 and fourth conductive layer 83 of the electronic component 90 facilitates the use of a depth drilling via or through-hole formation process.

Figure 12:
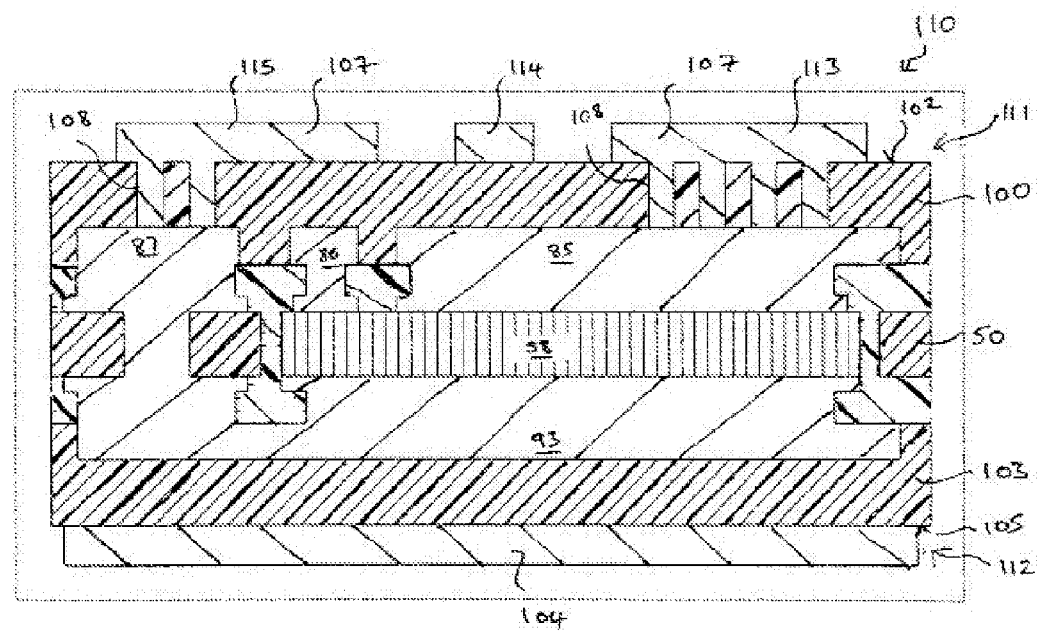
FIG. 12 illustrates a cross-sectional view of a laminated electronic component.

FIG. 12 illustrates a cross-sectional view of a further conductive layer 107 applied to the outermost surface 102 which at least lines the through-holes 108 and which extends onto the outermost surface 102 of the second substrate 100. The conductive layer 107 includes discrete portions which are electrically coupled to one of the electrodes of the semiconductor die 58 and which are electrically insulated from one another by intervening portions of the second substrate 100. The further conductive layer 107 provides the outer contacts of the laminated electronic component 110. The further conductive layer 107 may include one or more drain outer contacts 115, one or more gate outer contacts 114 and one or more source outer contacts 113 arranged on the outermost surface 102 of the second substrate 100.

In some embodiments, before lamination of the second substrate 100 and, if applicable, the third substrate 103, the outermost surface of the fourth conductive layer 83 may be roughened in order to produce additional mechanical interlocking between the material of the substrates 100, 103 and the fourth conductive layer 83. In some embodiments, the fourth conductive layer 83 may be etched to produce a roughened surface. The etching may be carried out so as to preferably etch the grain boundaries of the fourth conductive layer 83 thus increasing the surface area of the fourth conductive layer 83.

In embodiments in which the second and third substrates 100, 103 include a partially cured thermosetting resin upon lamination, the stack may be subjected to a curing treatment to further and even completely cure the thermosetting resin of the second substrate 100 and the third substrate 103.

Figures 13A, 13B:
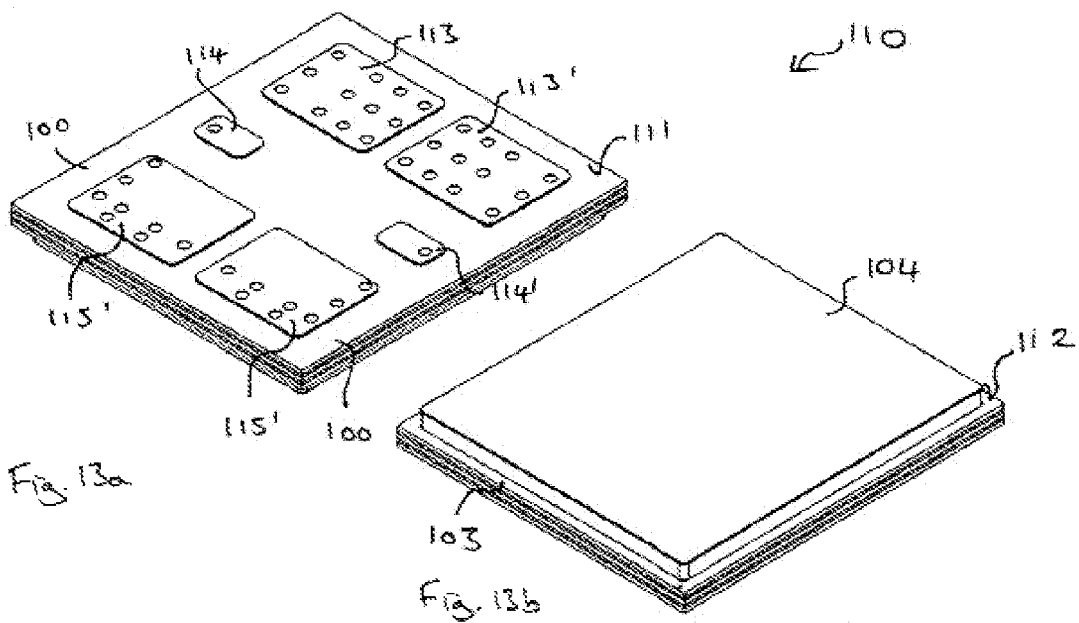
FIG. 13a illustrates a perspective bottom view of the laminated electronic component of FIG. 12.
FIG. 13b illustrates a perspective top view of the laminated electronic component of FIG. 12.

FIG. 13a illustrates a perspective bottom view and FIG. 13b illustrates a perspective top view of a laminated electronic component, for example of the lower surface 111 and the upper surface 112, respectively, of the laminated electronic component 110 of FIG. 12.

FIG. 13a illustrates the lateral arrangement of the contact pads of the laminated electronic component 110. As can be seen in the three-dimensional perspective view of the lower surface 111, in this particular embodiment, the laminated electronic component 110 includes two source pads 113, 113', two gate pads 114, 114' and two drain pads 115, 115'. The gate pad 114 is arranged between the source pad 113 and the drain pad 115 and the gate pad 114' is arranged between the source pad 113' and the drain pad 115'. However, the number and lateral arrangement of the contact pads of the laminated electronic component 110 is not limited to the arrangement illustrated in FIG. 13a and may vary.

As is illustrated in FIG. 13b, the upper surface 112 of the laminated electronic component 110 may include a portion of the conductive layer 104 which is electrically insulated from the conductive redistribution structure coupling the drain pad 62 on the semiconductor die 58 to the drain pads 115, 115' by the third substrate 103.

In embodiments in which the through-holes 108 are not entirely filled with conductive material, the position of the through holes may be visible in the contact pads 113, 113' 114, 114', 115 and 115'.

The laminated electronic component 110 may be a discrete power device. For example, the laminated electronic component 110 may include a single transistor device embedded in the first substrate 50. However, the methods described herein are not limited to a component including a single semiconductor die and may also be applied to multichip modules where the semiconductor die are mounted in opposing directions, for example a first transistor device may have a source down, drain up arrangement and a second transistor device may have a drain down, source up arrangement.

The methods described herein to produce the laminated electronic device may be considered as a hybrid technology using a photo-imaging and build-up technology to fabricate the inner layers, such as the dielectric layer 53 and the third and fourth conductive layers 77 and 83 of the electronic component 90, and using a lamination and microvia (blind via) technology on the outer dielectric layer or layers 100, 103. When producing an SMD (Surface mount Device) component, this hybrid technology may be used to produce high density connections, to produce large and small connection areas. A thick conductive structure can be built up close to the surfaces of the semiconductor die, photo-imaging processing may be cost effective and the processing route supports simple build up stages. The final footprint is positive as it stands higher than the surrounding area.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. An electronic component, comprising:
a first dielectric layer comprising an organic component having a decomposition temperature of at least 180° C.;
a semiconductor die embedded in the first dielectric layer;
a second dielectric layer arranged on a first surface of the first dielectric layer, the second dielectric layer comprising a photo definable polymer composition and defining two or more discrete openings comprising conductive material;
a first substrate arranged on the second dielectric layer and on the conductive material;

at least one conductive via extending from an outermost surface of the first substrate to a first conductive layer electrically coupled to the conductive material, the at least one conductive via positioned directly above a major surface of the semiconductor die; and one or more contact pads arranged on the outermost surface of the first substrate, wherein the first substrate comprises a filler embedded in a dielectric matrix.

2. The electronic component of claim 1, wherein at least one of the one or more contact pads is electrically coupled to the semiconductor die.

3. The electronic component of claim 1, further comprising a second substrate arranged on a second surface of the first dielectric layer, the second surface opposing the first surface.

4. The electronic component of claim 3, further comprising a second conductive layer arranged on the second substrate.

5. The electronic component of claim 1, wherein the first dielectric layer includes a filler.

6. A method, comprising:

laminating a first substrate on a first surface of an electronic component comprising a first dielectric layer comprising an organic component having a decomposition temperature of at least 180° C., a semiconductor die embedded in the first dielectric layer, a second dielectric layer arranged on a first surface of the first dielectric layer, the second dielectric layer comprising a photo definable polymer composition and defining two or more discrete openings comprising conductive material, and a first conductive layer arranged on the second dielectric layer and on the conductive material; and laminating a second conductive layer on the first substrate, wherein the method further comprises introducing at least one conductive via extending through the first substrate, the second dielectric layer, and the first dielectric layer to electrically couple to an electrode located on a rear surface of the semiconductor die, the at least one conductive via being positioned adjacent a side face of the semiconductor die, wherein the first substrate comprises a partially cured thermosetting resin, and wherein the method further comprises curing the partially cured thermosetting resin.

7. The method of claim 6, further comprising:

exposing portions of the first conductive layer of the electronic component; and introducing conductive material into the vias to couple the first conductive layer of the electronic component to the second conductive layer.

8. The method of claim 6, further comprising patterning the second conductive layer to expose regions of the first substrate.

9. The method of claim 6, further comprising:

applying a further conductive layer on the first substrate; and patterning the further conductive layer to produce contact pads.

10. The method of claim 6, further comprising etching an outermost surface of the first conductive layer of the electronic component and increasing the surface roughness.

11. The method of claim 10, wherein the etching comprises etching the grain boundaries of the first conductive layer of the electronic component.

12. The method of claim 6, further comprising laminating a second substrate on a second surface of the electronic component, the second surface opposing the first surface.

13. The method of claim 12, further comprising laminating a fourth conductive layer on the second substrate.

14. An electronic component, comprising:

a first dielectric layer comprising an organic component having a decomposition temperature of at least 180° C.;

a semiconductor die embedded in the first dielectric layer;

a second dielectric layer arranged on a first surface of the first dielectric layer and a first surface of the semiconductor die, the second dielectric layer comprising a photo definable polymer composition and defining a plurality of discrete openings, at least one first discrete opening being arranged on the first surface of the first dielectric layer and at least one second discrete opening being arranged on the semiconductor die;

a first conductive layer arranged in the at least one first and second discrete openings, wherein an upper surface of the first conductive layer is substantially coplanar with an upper surface of the second dielectric layer;

a second conductive layer arranged between the first surface of the first dielectric layer and the first conductive layer, the second conductive layer comprising two or more discrete portions that are electrically insulated from one another by intervening regions of the first dielectric layer;

a metallization formed on the first surface of the semiconductor die, the metallization being substantially coplanar with the second conductive layer; and a third conductive layer arranged on a second surface of the first dielectric layer, the second surface opposing the first surface, wherein the at least one first discrete opening extends through the first and second dielectric layers as well as the second and third conductive layers in one or more of the discrete portions of the second conductive layer, wherein the electronic component is a vertical device comprising contact pads on first and second opposing surfaces of the semiconductor die, wherein a contact pad on the second surface of the semiconductor die is electrically coupled to at least one conductive via.

15. The electronic component of claim 14, further comprising a fourth conductive layer arranged on at least regions of the second dielectric layer and the first conductive layer.

16. The electronic component of claim 15, wherein the fourth conductive layer comprises a redistribution structure coupling the semiconductor die with a conductive area of the first conductive layer arranged on the first surface of the first dielectric layer.

17. The electronic component of claim 15, wherein an outermost surface of the fourth conductive layer comprises etched grain boundaries.

18. The electronic component of claim 14, further comprising a seed layer arranged on side faces of the at least one via extending though the first dielectric layer, on portions of the first dielectric layer and on the first conductive layer.

19. The electronic component of claim 14, wherein the first dielectric layer comprises an aperture and the semiconductor die is arranged in the aperture.

20. The electronic component of claim 19, further comprising a spacer arranged between a side face of the semiconductor die and a side face of the aperture.

21. The electronic component of claim 20, wherein the second dielectric layer is arranged on the spacer.

22. The electronic component of claim 14, wherein the first dielectric layer comprises a filler.

23. A method, comprising:
embedding a semiconductor die in a first dielectric layer comprising an organic component having a decomposition temperature of at least 180° C.;
applying a second dielectric layer to a first surface of the first dielectric layer and a first surface of the semiconductor die, the second dielectric layer comprising a photo definable polymer composition;
defining a plurality of openings in the second dielectric layer, at least one opening being arranged on the first surface of the first dielectric layer and at least one opening being arranged on the semiconductor die;
forming a first conductive layer in the openings, the second dielectric layer and the first conductive layer having a substantially coplanar upper surface;
arranging a second conductive layer between the first surface of the first dielectric layer and the first conductive layer such that the second conductive layer comprises two or more discrete portions that are electrically insulated from one another by intervening regions of the first dielectric layer;
forming a metallization on the first surface of the semiconductor die, the metallization being substantially coplanar with the second conductive layer;
arranging a third conductive layer on a second surface of the first dielectric layer, the second surface opposing the first surface;
applying a seed layer to side faces of at least one through-hole extending though the first dielectric layer, to the second dielectric layer and to the second and third conductive layers,
wherein the at least one opening arranged on the first surface of the first dielectric layer extends through the first and second dielectric layers as well as the second and third conductive layers in one or more of the discrete portions of the second conductive layer,
wherein the first conductive layer is applied to the seed layer and introduced into the through-hole.

24. The method of claim 23, further comprising applying a fourth conductive layer onto at least regions of the second dielectric layer and the first conductive layer.

25. The method of claim 24, further comprising patterning the fourth conductive layer to provide a redistribution structure and to couple two or more discrete regions comprising the first conductive layer to one another.

26. The method of claim 24, further comprising etching an outermost surface of the fourth conductive layer.

27. The method of claim 26, wherein the grain boundaries of the outermost surface are preferably etched.

28. The method of claim 23, wherein the first dielectric layer comprises cured thermosetting resin and an aperture and the semiconductor die is arranged in the aperture.

29. The method of claim 28, further comprising arranging a spacer between a side face of the semiconductor die and a side face of the aperture.

30. The method of claim 29, wherein the second dielectric layer is applied to the spacer.

31. The method of claim 23, wherein the second dielectric layer extends from the first dielectric layer to the semiconductor die.

32. The method of claim 23, wherein the seed layer is applied by electroless plating.

33. The method of claim 23, wherein the seed layer is applied by direct metallization.

34. The method of claim 24, wherein the first conductive layer is applied by electroplating.

35. The method of claim 34, wherein the fourth conductive layer is applied to the first conductive layer by electroplating.

36. The method of claim 35, further comprising removing portions of the seed layer uncovered by at least one of the first conductive layer and the fourth conductive layer.

37. The method of claim 36, wherein the seed layer is removed by wet etching.

38. A method, comprising:
embedding a semiconductor die in a first dielectric layer comprising an organic component having a decomposition temperature of at least 180° C.;
applying a second dielectric layer to a first surface of the first dielectric layer and a first surface of the semiconductor die, the second dielectric layer comprising a photo definable polymer composition;
defining a plurality of openings in the second dielectric layer, at least one opening being arranged on the first surface of the first dielectric layer and at least one opening being arranged on the semiconductor die;
applying a conductive material into the openings, the second dielectric layer and the conductive material having a substantially coplanar upper surface;
applying a conductive layer electrically coupling the conductive material arranged in at least two of the openings;
laminating a first substrate on the second dielectric layer and conductive layer;
laminating a second conductive layer on the first substrate;
electrically coupling the second conductive layer to the first conductive layer by introducing a through-hole from the second conductive layer, through the first substrate to the first conductive layer and introducing the conductive material into the through-hole; and
applying a seed layer to side faces of a further through-hole extending though the first dielectric layer, to the second dielectric layer and to the conductive material,
wherein each of the first dielectric layer and the first substrate comprises a filler.

39. The method of claim 38, wherein the first substrate comprises a partially cured thermosetting resin and the method further comprises curing the partially cured thermosetting resin.

40. The method of claim 38, wherein the conductive material and the conductive layer are applied to the seed layer by electroplating.

41. The electronic component of claim 1, wherein the first substrate comprises one or more of: partially cured resin impregnated woven glass fibres and fully cured resin impregnated glass fibres.

42. The electronic component of claim 1, wherein each of the first dielectric layer and the first substrate comprises one or more of: a thermosetting dielectric and a filler.

43. The method of claim 6, wherein the first substrate comprises one or more of: partially cured resin impregnated woven glass fibres and fully cured resin impregnated glass fibres.

44. The method of claim 6, wherein each of the first dielectric layer and the first substrate comprises one or more of: a thermosetting dielectric and a filler.

45. The method of claim 23, wherein sidewalls of the at least one opening arranged on the first surface of the first dielectric layer is composed of the first dielectric layer material.

* * * * *

UNITED STATES PATENT AND TRADEMARK OFFICE
CERTIFICATE OF CORRECTION

PATENT NO. : 9,831,147 B2
APPLICATION NO. : 14/953865
DATED : November 28, 2017
INVENTOR(S) : M. Standing Page 1 of 1

It is certified that error appears in the above-identified patent and that said Letters Patent is hereby corrected as shown below:

In the Claims

Column 20, Line 37 (Claim 38, Line 29) please change "though the" to -- through the --

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*